(12) United States Patent
Shaw et al.

(10) Patent No.: US 11,628,476 B2
(45) Date of Patent: *Apr. 18, 2023

(54) SYSTEMS AND METHODS FOR SORTING AND COLLECTING ENHANCED GRADE METAL-BEARING ORES FROM METAL BEARING ORES

(71) Applicant: CD Processing Ltd., London (GB)

(72) Inventors: Daniel Shaw, Haverford, PA (US); James Saville, Easton, MD (US)

(73) Assignee: CD Processing Ltd., London (GB)

( * ) Notice: Subject to any disclaimer, the term of this patent is extended or adjusted under 35 U.S.C. 154(b) by 292 days.

This patent is subject to a terminal disclaimer.

(21) Appl. No.: 17/066,645

(22) Filed: Oct. 9, 2020

(65) Prior Publication Data

US 2021/0023588 A1 Jan. 28, 2021

Related U.S. Application Data

(63) Continuation of application No. 16/582,104, filed on Sep. 25, 2019, now Pat. No. 10,799,916, which is a
(Continued)

(51) Int. Cl.
*B07C 5/344* (2006.01)
*B07C 5/36* (2006.01)
*G01N 24/08* (2006.01)

(52) U.S. Cl.
CPC .............. *B07C 5/344* (2013.01); *B07C 5/361* (2013.01); *G01N 24/081* (2013.01); *B07C 2501/0018* (2013.01); *B07C 2501/0036* (2013.01)

(58) Field of Classification Search
CPC . B07C 5/344; B07C 5/361; B07C 2501/0018; B07C 2501/0036; G01N 24/081
(Continued)

(56) References Cited

U.S. PATENT DOCUMENTS 8,967,384 B2 * 3/2015 Kingman ................ B07C 5/363
209/4
9,316,537 B2 4/2016 Bamber et al.
(Continued)

FOREIGN PATENT DOCUMENTS

CA 2854654 A1 * 6/2013 ............. B07C 5/344
WO 2011075768 A1 6/2011
(Continued)

OTHER PUBLICATIONS

International Search Report and Written Opinion issued by the European Patent Office dated Mar. 20, 2020 for PCT/IB2019/059505.
(Continued)

*Primary Examiner* — Terrell H Matthews
(74) *Attorney, Agent, or Firm* — Caesar Rivise, PC

(57) ABSTRACT

Disclosed is a system for sorting copper-bearing ore to select portions having a desired target copper content. The system includes a first magnetic resonance analyzer for measuring the copper content of ore input into the system and a controller that controls a diverter to divert portions of the input ore to a collection path when the copper content meets or exceeds a predetermined cut-off value. The system also includes a second magnetic resonance analyzer to measure the copper content of the ore in the collection path. The measurements are then fed back to the controller where the controller can adjust the predetermined cut-off value above, up or down, to optimize the yield of ore with the targeted copper content.

20 Claims, 4 Drawing Sheets

Related U.S. Application Data continuation of application No. 62/771,280, filed on Nov. 26, 2018.

(58) Field of Classification Search
    USPC .......................................................... 209/567
    See application file for complete search history.

(56) References Cited

U.S. PATENT DOCUMENTS

| | | | |
|---|---|---|---|
| 9,968,945 B1 | 5/2018 | Filmer et al. | |
| 2015/0122705 A1* | 5/2015 | Latti ..................... | G01N 33/24 |
| | | | 209/555 |
| 2018/0238976 A1 | 8/2018 | Miljak | |
| 2018/0246047 A1* | 8/2018 | Miljak ................. | G01N 24/081 |
| 2018/0369869 A1* | 12/2018 | Filmer ................... | C22B 11/00 |
| 2020/0164409 A1* | 5/2020 | Shaw ................... | G01N 24/081 |

FOREIGN PATENT DOCUMENTS

| | | | | |
|---|---|---|---|---|
| WO | WO-2011075768 A1 * | 6/2011 | ............... | B07C 5/34 |
| WO | 2017031537 A1 | 3/2017 | | |
| WO | 2020109893 A1 | 6/2020 | | |
| WO | WO-2020109893 A1 * | 6/2020 | ............. | B07C 5/344 |

OTHER PUBLICATIONS

Chilean Office Action dated Jul. 20, 2022 for Application No. 202101358.

\* cited by examiner

SYSTEMS AND METHODS FOR SORTING AND COLLECTING ENHANCED GRADE METAL-BEARING ORES FROM METAL BEARING ORES

CROSS-REFERENCE TO RELATED APPLICATIONS

This application is a Continuation of U.S. application Ser. No. 16/582,104, filed on Sep. 25, 2019, entitled Systems And Methods For Sorting And Collecting Enhanced Grade Metal-Bearing Ores From Metal Bearing Ores, which claims the benefit under 35 U.S.C. § 119(e) of Provisional Application Ser. No. 62/771,280 filed on Nov. 26, 2018, entitled Systems and Methods for Sorting and Collecting Enhanced Grade Metal-Bearing Ores from Metal Bearing Ores.

FIELD OF THE INVENTION

This invention relates generally to mining and more particularly to systems and methods for sorting and collecting a predetermined grade metal-bearing ore, e.g., copper-bearing ore, from metal-bearing ore.

SPECIFICATION

BACKGROUND OF THE INVENTION

The mining of metals, such as copper, from metal-bearing ore typically entails initially taking core samples of an orebody to determine the potential grades of the ore therein. Porphyry copper orebodies are typically very large (hundreds of millions of tons) but low grade—typically less than 1.0% copper content. They may contain other valuable metals—gold, silver, molybdenum and magnetite as well as deleterious minerals containing arsenic and sulphur. The copper ore may be mined by open pit or underground methods depending on the shape and extent of the orebody. The orebodies were formed by a process of magma flow and then the metallic minerals were deposited from flow of hydrothermal mineralizing fluids containing metallic compounds along a network of veinlets and cracks through the cooling magma over millions of years. Typically most (e.g., 75%+) of copper minerals are found as small crystalline particles in the quartzite and volcanic breccia depositions in host rocks of the orebody close to the weathered surface with the balance disseminated in the host rocks. Chalcopyrite ($CuFeS_2$) is the most common copper mineral and bornite, covellite and chalcocite are often found in the weathered sections close to the surface.

Most orebodies are heterogeneous with regions of high grade, medium or low grade ore interspersed with large and small volumes of barren waste rock that may be considered as internal or external dilution of regions of the ore. In open pit mines the geological boundaries between minerals of different grades are defined by core drilling and blast hole drilling and inspection of the ore after blasting of blocks of ore. The broken rock areas after blasting and excavation are delineated by grade for processing or disposal as low grade ore or waste rock. The purpose of ore sorting of ore is to separate acceptable grade ore material at a desired average grade, hereinafter "target grade", from lower grade ore and waste rock for further processing and recovery of valuable minerals.

Bulk ore sorting of batches of ore offers the mine owner the opportunity to economically maximize the recovery and the quality of the ore from the mine since the low grade or marginal grade ore, while not high-grade, will nevertheless contain portions of ore of desired average percent by weight of the copper which could otherwise be wasted and not recovered. While, sorting of ore on a moving conveyor has been accomplished heretofore, it has been done at a relatively low speed via the use of systems and methods such as and including X-ray fluorescence analysis, X-Ray Transmission, gamma neutron activation analysis and particle color sensors to identify particles of ore that contain sufficient percent of copper therein. Those sensors are used to sense the particular ore pieces or particles carried on the conveyor past the sensor and to provide signals to some mechanical or pneumatic device to select those ore pieces or particles that are deemed to have a sufficient percent copper in them and divert the selected pieces for subsequent collection and use.

The Commonwealth Scientific and Industrial Research Organisation (CSIRO) of Australia has developed a magnetic resonance apparatus or analyzer (MRA) for conducting on-line measurements of ore-bearing rock carried on a moving conveyor to measure the grade of specific elements or minerals in the ore. International Application WO2017/031537 discloses that apparatus or analyzer. The MRA can be "tuned" to rapidly identify and count the number of chalcopyrite crystals in ore particles independent of the composition of the surrounding rock. In particular, the MRA can be used to count the number of particles of chalcopyrite in a "slice" consisting of many pieces of ore placed inside the radio frequency coil. If the weight of the ore in the slice is known, the count can be converted to weight of chalcopyrite in the total mass of material, i.e., weight % of chalcopyrite. For a given orebody type of host rock and minerals present, the MRA result can be calibrated to calculate the total copper content of the slice of ore.

NextOre Pty Ltd, of Australia, a joint venture between CSIRO, RFC Ambrian and Advisian Digital, is presently making available MRA sensors for ore sorter systems. The MRA sensor serves to measure the grade of a crushed run-of-mine ore to enable the selection of consecutive slices of material, hereinafter "pods" of material, with an average total copper content above a predetermined cut-off grade from pods of material below that cut-off grade to produce higher grade but lower tonnage mill feed. The MRA sensor is located adjacent to the belt carrying the crushed ore pieces bearing the target mineral (the "feed") to measure the quantity of the target mineral therein. The data resulting from the MRA measurement is combined with data from an associated belt weightometer to enable the calculation of the grade of the pod of feed material. That information can then be used to control a diverter apparatus located adjacent the terminus of the conveyor to direct pods of the feed material above a user-specified minimum grade (e.g., a "cut-off grade") to a station for collection, and pods of the feed material below that user-specified cut-off grade to a station for disposal as waste. The more heterogeneous the ore-bearing material, the more effective the sorter system is owing to the nature of the MRA sensor to identify and measure the mineral content of the pods and thereby copper content of pods that are above or below a cut-off grade.

The MRA sensor is able to quantify the mineral phases of copper-bearing ore via the excitation of the mineral phases by a radio frequency (RF) pulse to elicit an echo signal. For example, chalcopyrite has a resonance for Cu at 18.46 MHz, therefore the strength of the response as measured by the sensor can be used to quantify the concentration of chalcopyrite in the ore.

As will be appreciated by those skilled in the art since the above described prior art sorting criteria is based on an average cut-off grade, the portions of the pods which were accepted and collected may have more than the desired percentage of the copper therein, and some of the portions of the pods passed to waste may have sufficient amounts of the copper therein when added to the higher grade pods to result in the sorted ore product having the desired average percentage grade, i.e., target grade. Thus, if those portions of the pods having sufficient amounts of the copper therein that would have otherwise been relegated to waste are recovered, they can increase the yield of feed material at the target grade.

The subject invention provides a means and methods for optimizing yields from copper-bearing ore utilizing MRA sensing. Thus, if some of those portions of the pods that would have otherwise been relegated to waste are recovered, they can increase the yield at the target grade. Moreover, value can be gained from low-grade stockpiles or resources of declining grade if they are sufficiently heterogeneous to permit separation of higher grade material from lower grade material. Further still, with the subject invention used to recover higher grade pods from lower grade ore, one can increase reserves of recoverable ore. The use of this ore sorting system with lower grade material to produce additional feed to the ore concentrator at the target grade improves overall mining recovery without displacing higher grade feed, and delivers effective reductions in mining costs per unit of metal produced. Further still, the subject invention enables one to provide a higher and/or more consistent grade material, more pounds of metal per ton of feed material, all the while reducing processing costs, and possibly reducing plant size and concomitant capital costs to achieve the same or higher level of metal production.

It should be pointed out at this juncture that while the subject invention will be described with reference to sorting of copper-bearing ores, it is not so limited. Thus, the subject invention can be used for optimizing the sorting and collection of other metal-bearing ores, e.g., copper nickel ores, iron ores.

All prior art references cited in this application are specifically incorporated herein in their entireties

BRIEF SUMMARY OF THE INVENTION

One aspect of this invention is a system for sorting ore containing a desired target grade of metal-bearing ore from a metal-bearing ore provided along a first conveyor. The target grade has a desired average percentage by weight of the metal therein. The first conveyor moves at a predetermined speed and has an exit point. The system comprises a first magnetic resonance analyzer unit, a second magnetic resonance analyzer unit, a controller, and a diverter. The first magnetic resonance analyzer unit includes a first magnetic resonance analyzer and a first weighing device. The first magnetic resonance analyzer unit is configured for measuring the percentage by weight of the metal in the metal-bearing ore on the first conveyor at successive points in time, for calculating the average percentage by weight of the metal in that ore at first predetermined length intervals of time, and for providing first electrical signals indicative thereof. The controller is used to establish a cut-off value of the average percentage by weight of the metal in the metal-bearing ore for producing the desired target grade. The controller is configured for receipt of the first electrical signals and produces select electrical signals when the average percentage by weight of the metal in the metal-bearing ore measured over the first predetermined length intervals of time on the first conveyor is equal to or greater than the cut-off value. The diverter is located adjacent to the exit point for receiving the metal-bearing ore from the first conveyor and is configured to divert portions of the metal-bearing ore from the first conveyor to either a collection path or a waste path in response to the select electrical signals. The collection path includes a second conveyor moving at a speed. The second magnetic resonance analyzer unit includes a second magnetic resonance analyzer and a second weighing device. The second magnetic analyzer unit is configured for measuring the percentage by weight of the metal in the metal-bearing ore on the second conveyor at successive points in time, for calculating the average percentage by weight of the metal in that ore measured over second predetermined length intervals of time, and for providing to the controller second electrical signals indicative of the average percentage by weight of the metal in that ore measured over the second predetermined length intervals of time. The controller may be used to dynamically adjust the cut-off value up or down to an adjusted value to produce the select signals if the average percentage by weight of the metal in the metal-bearing ore on the second conveyor measured over said second predetermined length intervals of time is below or above the desired target grade average percentage by weight, thereby causing the diverter to direct portions of the metal-bearing ore from the first conveyor to the second conveyor when the average percentage by weight of the metal in the metal-bearing ore on the first conveyor measured over the first predetermined length intervals of time is equal to or greater than the adjusted value.

In accordance with one preferred aspect of the system of this invention, grade of metal-bearing ore is copper-bearing ore and the metal is copper.

In accordance with another preferred aspect of the system of this invention, the controller is used to dynamically adjust the cut-off value up or down to said adjusted value as a function of the direction of trend lines formed by connecting sequential measurements of percentage by weight of the copper in the copper-bearing ore measured over first predetermined intervals of time on the first conveyor in response to said first electrical signals.

In accordance with another preferred aspect of the system of this invention, the slopes of trend lines are defined by lines connecting sequential values of the first electrical signals, and wherein the variations in slope of the trend lines are used by the controller to determine whether or not to further adjust the adjusted value.

In accordance with another preferred aspect of the system of this invention, each of the conveyors is of sufficient length and operates at such a speed so as to allow sufficient time for measurement and processing of data and the production of a select electrical signal in order to accurately direct the position of the diverter.

In accordance with another preferred aspect of the system of this invention, the predetermined speed of the first conveyor is in the range of 180 feet per minute to 600 feet per minute, and the predetermined period of time for measurement on the first conveyor is set as required, for example in the range of 1 to 10 seconds.

In accordance with another preferred aspect of the system of this invention, the desired average percentage by weight of copper for the target grade is 0.3% or a higher value, for the product on the second conveyor.

In accordance with another preferred aspect of the system of this invention, the diverter is a pivoting chute diverter.

Another aspect of this invention is a method for collecting a desired target grade of metal-bearing ore from a metal-bearing ore. The desired target grade has a desired average percentage by weight of the metal therein measured over predetermined length intervals of time. The method comprises providing the metal-bearing ore along a first conveyor moving at a predetermined speed. The first conveyor has an exit point. A first magnetic resonance analyzer unit including a first magnetic resonance analyzer and a first weighing device is used to continuously measure the percentage by weight of the metal in the metal-bearing ore on the first conveyor at successive points in time. The average percentage by weight of the metal in that ore at first predetermined length intervals of time is calculated, and first electrical signals indicative thereof are provided. A controller establishes a cut-off value of the average percentage by weight of the metal in the metal-bearing ore for producing metal-bearing ore at the desired target grade measured successively over second predetermined length intervals of time. The controller is configured for receipt of the first electrical signals to produce select signals when the average percentage by weight of the metal in the metal-bearing ore on the first conveyor measured over first predetermined length intervals of time is equal to or greater than the cut-off value. A diverter located adjacent the exit point receives the metal-bearing ore from the first conveyor and diverts it to either a collection path or a waste path. The collection path includes a second conveyor moving at a speed. The diverter is configured to direct the metal-bearing ore from the first conveyor to the second conveyor or to the waste path in response to the select signals. A second magnetic resonance analyzer unit including a second magnetic resonance analyzer and a second weighing device measures the percentage by weight of the metal in the metal-bearing ore for second predetermined length periods of time on the second conveyor at successive points in time. The average percentage by weight of the metal in the metal-bearing ore on the second conveyor measured over said second predetermined length intervals of time is calculated to provide to the controller second electrical signals indicative of the average percentage by weight of the metal in that ore. The controller is used to dynamically adjust the cut-off value up or down to an adjusted value to produce the select signals if the average percentage by weight of the metal in the metal-bearing ore on the second conveyor measured over the second predetermined length intervals of time is below or above the desired target average percentage by weight, thereby causing the diverter to direct portions of the metal-bearing ore from the first conveyor to the second conveyor when the average percent by weight of the metal in the metal-bearing ore on the first conveyor measured over the first predetermined length intervals of time is equal to or greater than the adjusted value.

In accordance with one preferred aspect of the method of this invention, the metal-bearing ore is copper-bearing ore and the metal is copper.

In accordance with another preferred aspect of the method of this invention, the controller also dynamically adjusts the cut-off value up or down to the adjusted value as a function of the direction of trend lines formed by connecting sequential measurements of percentage by weight of the copper in the copper-bearing ore measured over first predetermined intervals of time on the first conveyor in response to said first electrical signals.

In accordance with another preferred aspect of the method of this invention, the slopes of trend lines are defined by lines connecting sequential values of the first electrical signals, and wherein the variations in slope of the trend lines are used by the controller to determine whether or not to further adjust the adjusted value.

In accordance with another preferred aspect of the method of this invention, the second electrical select signal from the second magnetic resonance analyzer unit including a second magnetic resonance analyzer and a second weighing device is compared with the target percentage by weight of the copper in the copper-bearing ore on the second conveyor to dynamically adjust the cut-off value for the first magnetic resonance analyzer unit up or down to an adjusted value as a function of the difference of the measured weight percentage of copper in the ore at a second predetermined length interval of time, on the second conveyor magnetic resonance analyzer and second weighing device, from the target grade for copper content of the product copper-bearing ore.

In accordance with another preferred aspect of the method of this invention, each of the conveyors is set in accordance with the time needed to perform the measurement of the copper content in the ore. The predetermined speed of the first conveyor is in the range of 180-600 feet per minute, and the predetermined speed of the second conveyor is in the range of 180-600 feet per minute and the predetermined period of time for the first conveyor is in the range of 1-15 seconds and the predetermined speed of the second conveyor is in the range of 180-600 feet per minute, and the predetermined period of time for the second conveyor is in the range of 60-240 seconds.

In accordance with another preferred aspect of the method of this invention, the desired average percentage by weight for the target grade of copper content is 0.3%.

In accordance with another preferred aspect of the method of this invention, the copper-bearing ore on the second conveyor is delivered to a collection station.

In accordance with another preferred aspect of the method of this invention, the copper-bearing ore on the first conveyor is delivered to a waste station when the controller directs the diverter accordingly.

In accordance with another preferred aspect of the method of this invention, the diverter is a pivoting chute diverter.

In accordance with another preferred aspect of the method of this invention, the diverter is a diverter gate valve or a flop gate.

DETAILED DESCRIPTION OF ONE EXEMPLARY PREFERRED EMBODIMENT OF THE INVENTION

Figure 1:
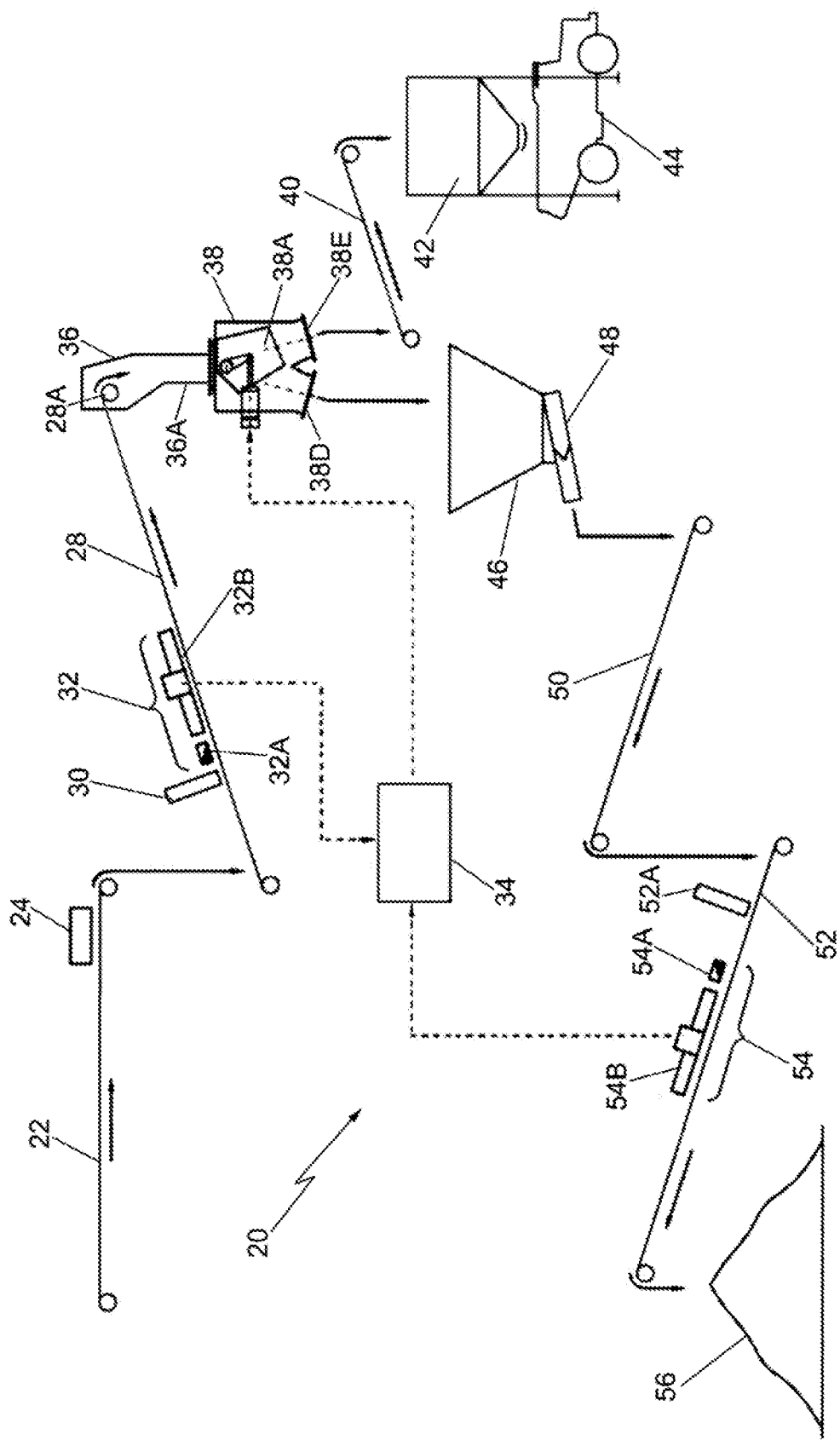
FIG. 1 is an illustrative diagram showing one exemplary embodiment of the sorting system of this invention for sorting and collecting copper-bearing ore having a desired target value of average weight percent of copper therein from copper-bearing ore provided to the system.

Referring now to the various figures of the drawing wherein like reference characters refer to like parts, there is shown in FIG. 1 one exemplary sorting system 20 constructed in accordance with this invention. The sorting system 20 is particularly suited for use in sorting copper-bearing ore, but can be used for sorting other metal-bearing ores. In any case the system 20 is configured to be used to sort low grade or marginal grade ore produced at a mine into ore having a desired average weight percentage content of valuable metal. For copper from a low-grade porphyry orebody, an ore having an average copper content of 0.3% by weight is typically acceptable commercially for further processing and concentration of copper minerals and subsequent smelting to copper metal. It should be noted that the acceptable weight percentage will vary from mine to mine, depending upon a number of various factors. Thus, the target average copper content of 0.3% as used herein is merely exemplary.

As can be seen in FIG. 1, the sorting system 20 includes an input belt conveyor 22 onto which the ore, e.g., copper-bearing ore, to be sorted is placed. That ore is carried on the conveyor in the direction shown by the arrow under a magnet 24. The magnet is located at the exit end portion of the conveyor 22 to attract any ferrous material that may be on the conveyor's belt so that such ferrous material does not pass with the ore for sorting. The pieces of ore drop off the exit end of the conveyor 22, whereupon they fall onto another conveyor 28 at the input end thereof. The conveyor 28 may be referred to as a feed conveyor and is a belt conveyor of conventional construction. Preferably, the feed conveyor 28 is a long, e.g., 120 to 150 feet length, device whose circulating belt moves the ore deposited on the upper surface thereof in the direction of the arrow shown at a predetermined rate of speed, e.g., belt speeds of 500 to 600 feet per minute, and with ore loading of 200 tons per hour up to 2,000 tons per hour.

The ore deposited on the feed conveyor 28 then passes under an adjustable height barrier 30. The barrier 30 is located upstream of a first magnetic resonance analyzer unit 32. The first magnetic resonance analyzer unit 32 includes a conventional belt scale or belt weighing device 32A, sometimes referred to as a "weightometer", and a first magnetic resonance analyzer 32B. The adjustable height barrier 30 serves to prevent any pieces of ore on the belt that extend upward beyond a predetermined height from reaching the analyzer 32B, since such pieces could damage the analyzer. In particular, the barrier 30 serves to "smooth out" the ore on the conveyor to an acceptable height by blocking any pieces of ore extending too high from the belt and causing such pieces to find a position on the belt where they will not extend upward beyond the desired height in order to protect the analyzer.

The belt scale or weightometer 32A of the analyzer unit 32 produces electrical signals representative of the mass of the ore carried by the moving belt of the feed conveyor 28. The magnetic resonance analyzer 32B is located adjacent, e.g., slightly downstream of the weightometer 32A. As will be described in more detail later, the analyzer 32B measures the content of the copper minerals in the pieces of the ore passing through its coil, whereupon the analyzer unit 32B provides first electrical output signals representative of the weight percent of copper in that ore in first predetermined length intervals of time, with each predetermined length interval of time representing a pod on the feed conveyor 28. In one exemplary embodiment of this invention the predetermined speed of the feed conveyor 28 is in the range of 180 feet per minute to 600 feet per minute, and the first predetermined length interval of time is in the range of 1 to 20 seconds. The first output electrical signals are provided to a controller 34. Preferably the controller is a programmable logic controller (PLC) suitable for use in a dusty industrial environment like a mine. Some of details of the PLC controller will be described later. Suffice it for now to state that the controller 34 establishes sorting criteria for deciding when portions or pods of the marginal ore on the feed conveyor 28 are to be selected to be passed to a product path for collection and subsequent processing (e.g., refining into copper), or are to be passed on to waste path for disposal.

Figure 2:
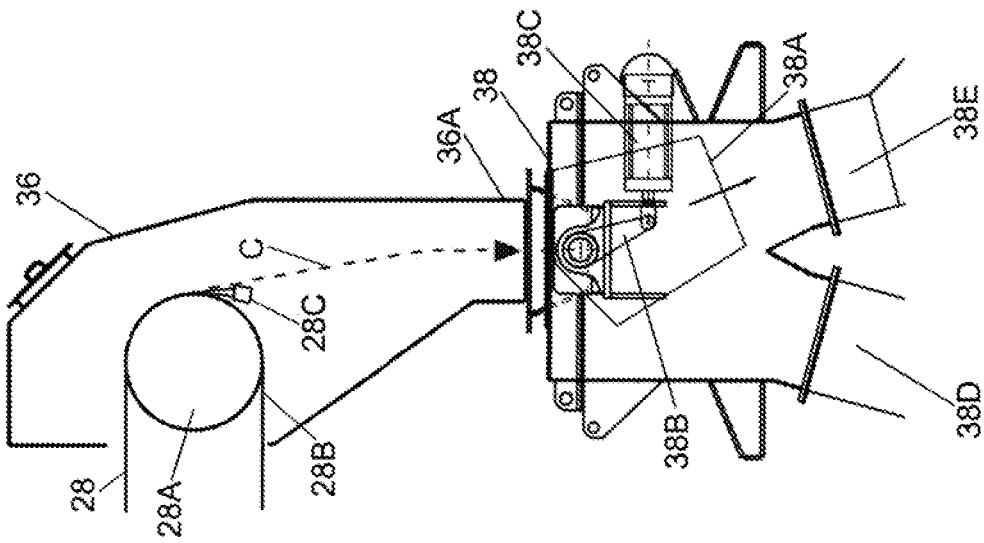
FIG. 2 is an illustration of a pivoting chute diverter forming a portion of the system of FIG. 1, with the diverter being shown in the position wherein it is diverting pods of the desired percentage copper-bearing ore from the ore for subsequent collection.
Figure 3:
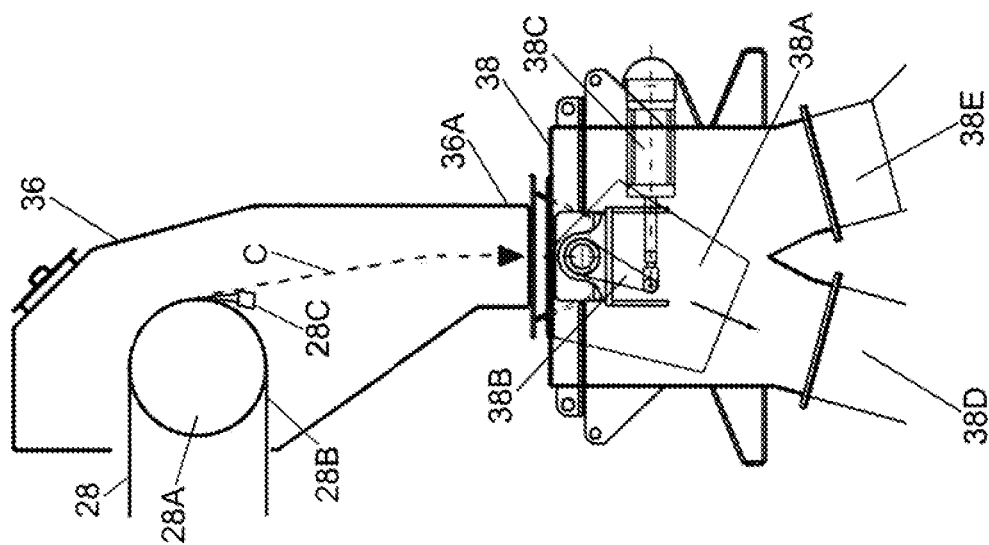
FIG. 3 is an illustration like that of FIG. 2 by showing the chute diverter in the position wherein it is diverting ore not having the desired average weight percent of copper therein for waste.

The output end of the feed conveyor 28, which is in the form of a pulley 28A about which the conveyor's belt 28B extends, is located within the interior of a diverter chute 36 as best seen in FIGS. 2 and 3 and which will be described in detail later. Thus the ore exiting the conveyor 28 drops through the diverter chute 36 into the inlet of a pivoting chute type diverter 38. The details of the pivoting chute diverter 38 will also be described later with respect to FIGS. 2 and 3. Suffice it for now to state that the pivoting chute diverter 38 includes a pivotable spout 38A which is configured to be pivoted from one position (hereinafter referred to as the "select" position) to another position (hereinafter referred to as the "waste" position), and vice versa, under control of the controller 34 in accordance with the sorting criteria. In particular, when the controller 34 determines that a pod of marginal ore on the conveyor 28 does not meet the sorting criteria the pivoting spout 38A will be pivoted to the waste position so that the ore pieces of that pod pass out of a waste outlet chute 38B of the diverter 38 onto a waste conveyor 40 in the waste path. The waste conveyor 40 can be of any type of construction and is configured to carry the waste pieces of ore to a station for disposal. In the exemplary embodiment shown the exit end of the waste conveyor serves to drop the waste ore into a bin 42, from which that ore can be loaded into the bed of a dump truck 44 for disposal.

Those pods of ore that are determined to meet the sorting criteria by the controller 34 are directed into a "collection" or "product" path by the diverter 38. In particular, when the controller determines that a pod of ore on the feed conveyor 28 meets the sorting criteria, the controller provides a signal indicative thereof, hereinafter called a "select" signal, to the diverter 38, to cause its pivotable chute 38A to pivot to the select position. With the spout in that position the ore pieces of the pod will drop out of what can be called the select outlet chute 38D of the diverter 38 and into a bin 46 forming a portion of the product path. The bin 46 includes a vibrating feeder 48, wherefrom the selected ore drops onto another conveyor 50. The conveyor 50 is a conventional conveyor of any suitable construction, preferably a belt conveyor. Thus, the ore from the diverter referred to as the "product ore" is carried on the belt of the conveyor 50 in the direction of the arrow shown below that conveyor. The outlet end of the conveyor 50 is located above the inlet end of another conveyor 52. The conveyor 52 is a belt conveyor like the feed conveyor 28, and will be referred to hereinafter as the "product conveyor".

The ore deposited on the product conveyor 52 then passes under an adjustable height barrier 52A. The barrier 52A is located upstream of a second magnetic resonance analyzer unit 54. The second magnetic resonance analyzer unit 54 is constructed like the first magnetic resonance analyzer unit and thus includes a second weightometer 54A and a second magnetic resonance analyzer 54B. The second weightometer is located slightly upstream of the second magnetic resonance analyzer 54B. The adjustable height barrier 52A serves to prevent any pieces of ore on the belt that extend upward beyond a predetermined height from reaching the analyzer 54B, since such pieces could damage the analyzer. Thus, like the barrier 30, the barrier 52A serves to smooth out the ore on the product conveyor so that no ore pieces extend upward beyond a desired height in order to protect the analyzer. The second magnetic resonance analyzer 54B measures the content of the copper in the pieces of the product ore passing through its coil, whereupon it provides second electrical output signals to the controller 34 which are representative of the actual weight percent of copper in the product ore in second predetermined length intervals of time, with each such second predetermined length interval of time representing a pod on the product conveyor 52. In accordance with one exemplary aspect of this invention the predetermined speed of the conveyor 52 is in the range of 180 feet per minute to 600 feet per minute, and the second predetermined length interval of time is in the range of 1 to 20 seconds.

The product ore carried on the product conveyor 52 drops off of the exit end of that conveyor into a stockpile 56 from whence it can be transported for further processing to extract the copper therefrom.

Each of the magnetic resonance analyzers 32B and 54B is preferably constructed in accordance with the teachings of the aforementioned CSIRO International Application WO2017/031537 and use high frequency radio waves to rapidly measure the copper mineral content of all of the pieces of ore on the associated conveyor's belt as they pass through the analyzer's coil (not shown). Each of the analyzer's coils is designed to completely surround the conveyor belt. Each analyzer provides electrical output echo signals representative of the concentration of the selected or target mineral phase of copper, e.g., chalcopyrite, in the ore to the controller 34. That controller includes a computer (not shown) and associated software (not shown) and is configured to receive electrical signals from the weightometers 32A and 54A and the analyzers 32B and 54B, respectively, to calculate the average percentage by weight of a particular, and preselected, copper bearing mineral, e.g., chalcopyrite, in the ore on the conveyors 28 and 52, respectively, over separately predetermined length intervals of time, i.e., the first predetermined length intervals of time and the second predetermined length intervals of time, respectively.

Each analyzer is capable of providing accurate measurement of the copper content of the ore on the associated conveyor's belt very quickly. Thus, the counting measurement is very fast, e.g., about 0.1 millisecond per slice of the cross-section of ore on the belt. In order to develop meaningful analyses for industrially meaningful weight of ore, the analyses of individual slices are accumulated to accurately define the average copper content of a larger mass of ore. For example, the analyzer units can be set up to calculate copper content of the ore as weight percent averaged every 2-5 seconds for a pod size of about 0.66-1.65 tons at a 1,200 tons per hour feed rate.

The first magnetic resonance analyzer unit 32B has two purposes. The first purpose is to determine the average weight percent of copper in the pods of marginal copper-bearing ore on the conveyor 28 and for providing electrical signals indicative thereof to the controller 34. To that end, the first magnetic resonance analyzer unit 32 measures the copper weight percent content of the slices of copper ore on the feed conveyor 28 and averages the data over integration periods of approximately 2-5 seconds, as selected by the operator and input into the controller. The average analysis is for a specific weight of ore (pod) as measured by the associated belt weighing device 32A with accuracy less than about 1%, preferably less than 0.5%. That data is provided by electrical signals to the controller 34.

Figure 4:
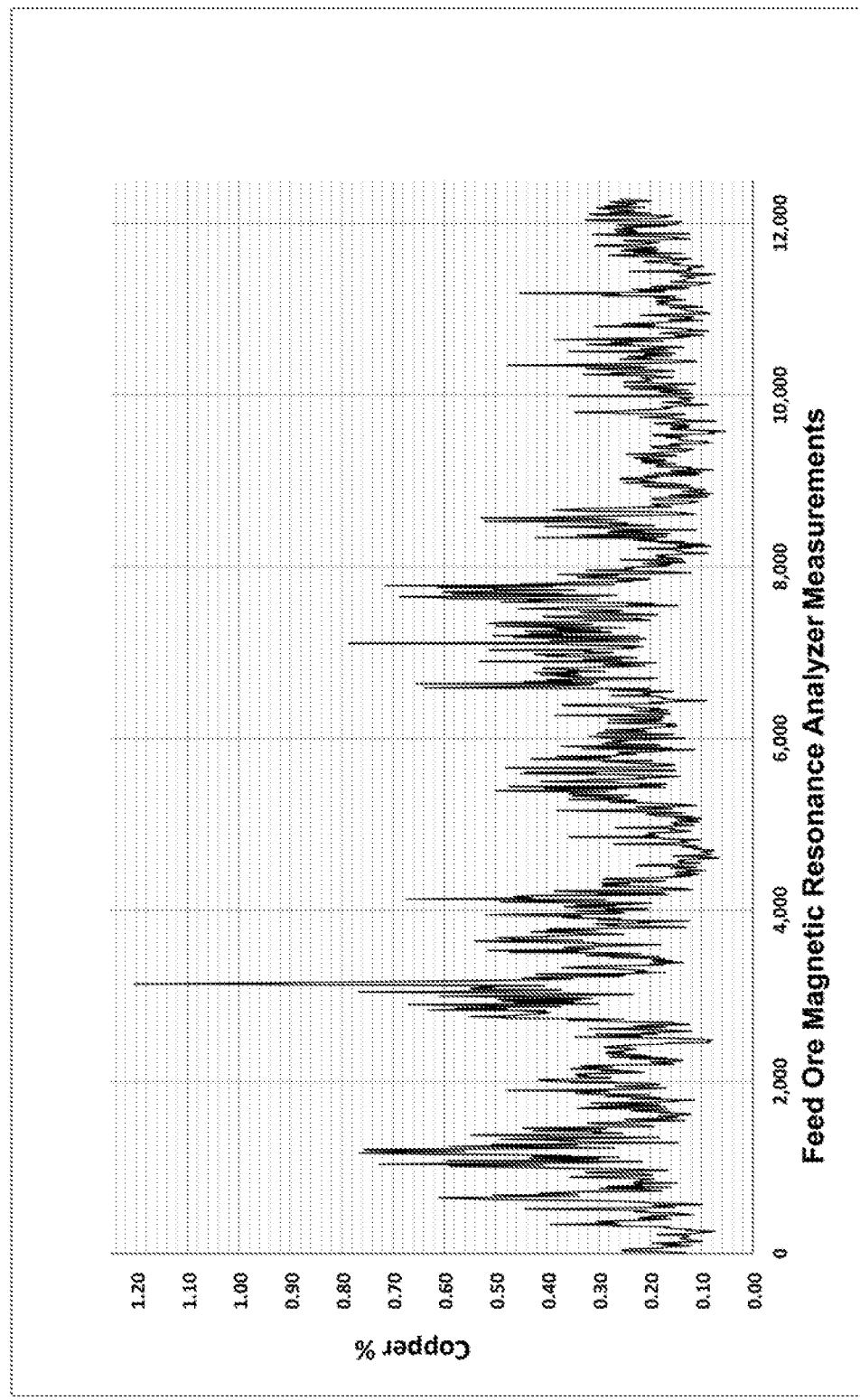
FIG. 4 is a graph of the average weight percentage of copper in the copper-bearing ore plotted against time and made up of 12,280 data points as determined by a first magnetic resonance analyzer unit which forms a portion of the sorting system of FIG. 1.

FIG. 4 is an exemplary graph showing a plot of values of the measured percentage by weight of copper in the copper-bearing ore on the feed conveyor 28 as a function of time, with each of the data points collected to produce the plot representing the average copper content for a 2-5 second integration period with each point representing the average copper content of ore equivalent to one pod of a 0.66-1.65 tons size. Thus, it can be seen that the percentage by weight of copper for the successive pods represented range from approximately 0.08% to 1.2%.

The second purpose of the first analyzer unit 32B is to determine if the average weight percent of the marginal ore on the conveyor 28 meets or exceeds a predetermined copper content value (which may also be referred to as a cut-off point) which is input into the controller by the user of the sorting system 20, e.g., the mine operator. If the average weight percent of the marginal ore measured over a first predetermined length interval of time meets or exceeds the predetermined cut-off value, the controller provides the heretofore identified "select" signal. That signal is provided to the diverter 38 to cause the pivoting spout 38A of the diverter 38 to be moved to position like shown in FIG. 2, whereupon the marginal ore on the feed conveyor 28 will be sent to the product path, e.g., to the product conveyor 52.

The predetermined cut-off value forms part of the heretofore mentioned sorting criteria. For example, if the user of the system 20 wishes to collect ore having an average weight percent of 0.3, shown by the horizontal line X in FIG. 5, the controller 34 will be set to a cut-off value that the user believes will result in that desired weight percent. In the example of FIG. 4, the initial cut-off value is 0.175% shown by the horizontal line Y in FIG. 5. The cut-off value is initially determined by the mine operator or user based on copper analysis information provided by exploration drill-core and blast-hole samples which resulted in the delineating the location of the marginal ore.

As mentioned earlier the second analyzer unit magnetic resonance analyzer 54B is constructed similarly to the first unit 32B. It also has two purposes. The first purpose is to analyze the product copper content of ore material on the conveyor 52 to determine the actual average copper content percent by weight of the ore passing through the magnetic analyzer over a second predetermined length interval of time. The second purpose is to feed back an electrical signal representative of the actual average copper content of the product ore measured over the second predetermined length intervals of time to the controller to dynamically adjust the cut-off value of the select signal from the controller up or down to an adjusted value, if necessary, to result in a desired target average copper grade of ore to be collected. In particular, if for the example given above, the desired target grade of marginal ore to be sorted and collected for further processing is to have an average weight percent of 0.3, and the initial setting of the cut-off value or set-point of 0.175 percent results in product ore having an actual average weight percent of 0.4 percent measured over a second predetermined length interval of time, the feedback signal provided by the analyzer unit 54B to the controller 34 will adjust the controller's cut-off value down to an adjusted value that is below 0.175% to bring the average weight percent of copper of the product ore over a second predetermined length interval of time down to the desired 0.3%. This action will allow more product ore to be collected, thereby increasing the yield and resulting in a more consistent analysis of the product. Conversely, if the feedback signal provided by the second analyzer unit 54B indicates that the product ore pods on the product conveyor 28 have an actual average weight percent of 0.28, the feedback signal provided by the analyzer unit 54B to the controller will adjust the controller's cut-off value to an adjusted value that is above the 0.175% set point to bring the average weight percent of the product ore over a second predetermined length interval of time up to the desired target value of 0.3%.

Figure 5:
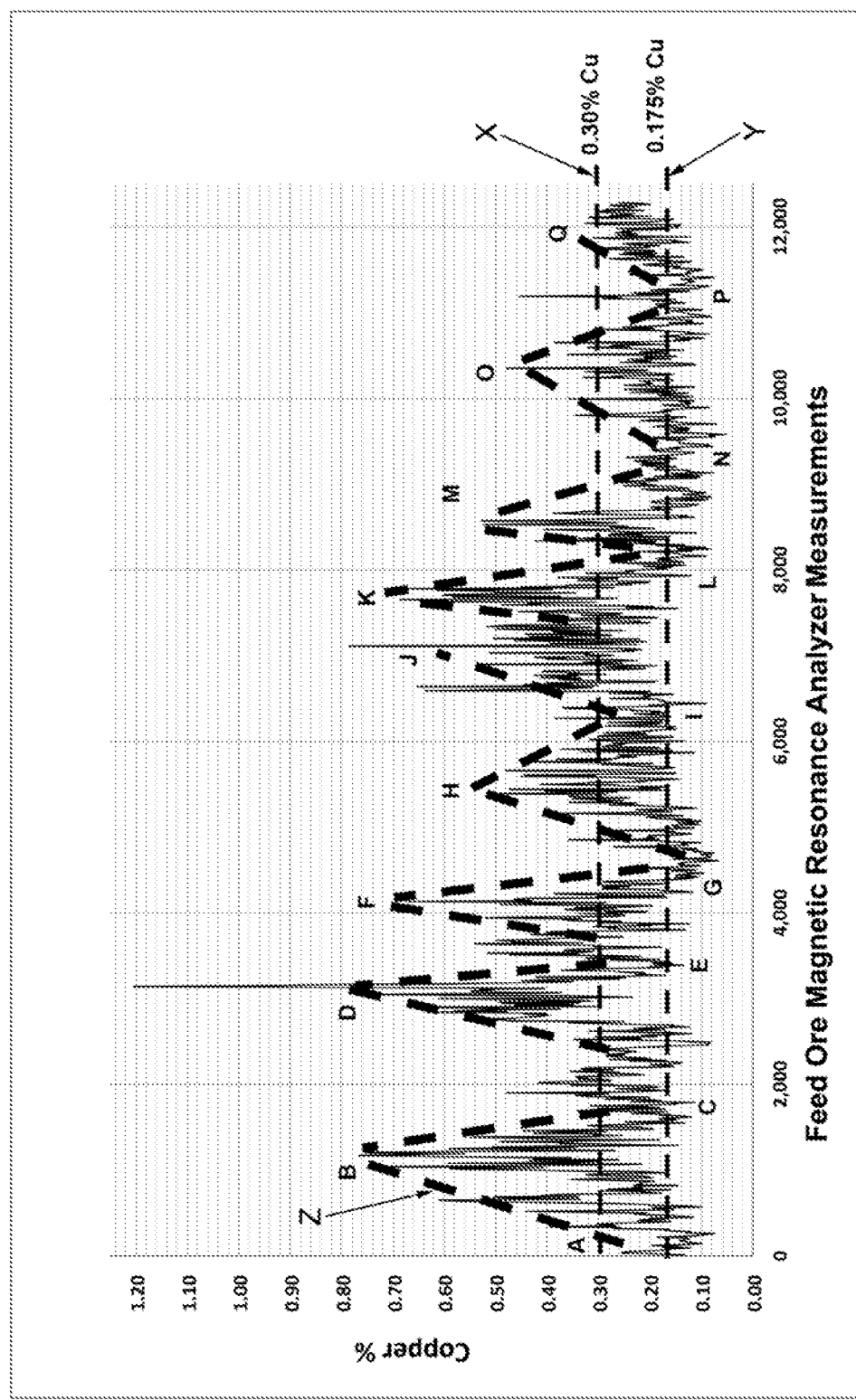
FIG. 5 is a graph like that of FIG. 4, but showing the operating parameters of a controller which also forms a portion of the sorting system of FIG. 1 and which is coupled to the first magnetic analyzer to provide feedback data using slope of consecutive analysis data from the magnetic resonance analyzer and associated weighing device to dynamically adjust the cut-off value used to direct the operation of the diverter.

The controller 34 may also be configured so that the select signal for the diverter produced by the controller may also be based on using what can be called trend lines of the individual measurements over the first predetermined length interval of time of the copper content of the ore percentages on feed conveyor 28 as part of the sorting criteria to dynamically control the diverter 38. Thus, the controller can use the copper percentage analysis data to prepare a running average trend line for the copper content of the marginal grade ore on the conveyor to dynamically adjust the cut-off value up or down to the adjusted value as a function of the trend lines. For example, as can be seen in FIG. 5 a plurality of trend lines are shown by thick broken lines Z. Each of the lines Z represents trends showing how the percentage content is increasing or decreasing as the pods of the ore on the feed conveyor travel through the first analyzer unit 32B. Thus, each of the trend lines has a slope, wherein the slopes of the trend lines are defined by continuous lines connecting sequential values of the first electrical signals, and wherein the variations in the slope of the trend lines are used by the controller 34 to determine whether or not to further adjust the adjusted value. Eleven such trend lines are shown in FIG. 5 and are labeled as A to L. In the example shown in FIG. 5, when the trend line is heading upwards such as E to F or G to H, the controller 34 can be set to direct the diverter 38 to send more marginal ore to the product path and less to waste path. The reason for this is that when the ore contains a higher copper % content one can increase copper recovery from the ore while ensuring that the product ore sent to the product stockpile 56 is close to an average copper content of 0.3% of the product over a second predetermined length interval of time. When the trend line is heading down such as D to E and F to G, the controller can be used to direct the diverter to allow less marginal ore to go to product path and more to the waste path. Again, this is so that the average copper content of the ore over the second predetermined length interval of time sent to the product stockpile is close to the required average 0.3% copper content of the product.

As should be appreciated by those skilled in the art while the second analyzer unit 54B sends average copper percentage analysis data to the controller, that data doesn't vary as much as the trend data from the first analyzer unit 32B, but it also fluctuates around the 0.3% copper content because of variations in the copper analysis of consecutive pods of ore selected by the diverter. The changes in the copper analysis trend line from the second analyzer 54B can thus be used by the controller to fine tune the performance of the diverter so that the analysis of the product ore stays close to but above the 0.3% desired grade.

Turning now to FIGS. 2 and 3, the details of the construction and operation of the diverter chute 36 and the pivoting chute diverter 38 will now be described. As can be seen the diverter chute 36 is a hollow housing having an opening 36A through which the output end of the feed conveyor 28 extends so that the portion of the belt 28B extending about the head pulley 28A, is located within the interior of a diverter chute 36.

As mentioned above the diverter 38 is preferably a pivoting chute type diverter. One particularly suitable diverter is available from Vortex Global Corporation, Salina Kans. USA under the model designation "Titan Series". The Titan Series of pivoting chute diverters are designed to receive a vertically falling stream of ore pieces at their inlet. Thus, the outlet chute 36A of the diverter chute is coupled to the inlet of the diverter 38. The inlet of the diverter 38 leads to a pivoting spout 38A, which is pivoted from side to side by a lever arm 38B coupled to a hydraulic actuator 38C. The diverter includes two outlet chutes, namely a "product" chute 38D and a "waste" chute 38E. The product chute 38D is open at its bottom and is arranged to receive ore from the pivoting spout when the spout is in the position shown in FIG. 2 to pass the ore into the product path. The waste chute 38E is open at its bottom and is arranged to receive ore from the pivoting spout when the spout is in the position shown in FIG. 3 to pass the ore into the waste path.

The hydraulic actuator is under control of electrical signals from the PLC controller 34. In particular, when the controller produces the heretofore mentioned select signal, the actuator will pivot the spout 38A to the position shown in FIG. 2, whereupon the ore pieces exiting the spout will drop out of the spout and pass through the product chute 38D into the bin 46. Otherwise the spout will be in position shown in FIG. 3, whereupon the ore pieces exiting the spout will drop out of the spout and pass through the waste chute 38E to the conveyor 40. The hydraulic actuator's stroke movement and speed can be controlled to split the discharge from the feed conveyor 28 to either chute 38D or 38E as required under the control of the controller 34.

Since fine ore particles or pieces, commonly known as "fines" below about 4 mesh Tyler screen size tend to stick to the belt 28B so as to be carried around the head pulley 28A further than coarser ore particles or pieces, the chute diverter 36 includes a belt scraper 28C. The belt scraper 28C is located immediately adjacent the belt 28B at the head pulley 28A to scrape off any fines which would tend to stick to the belt 28B as it is carried around the head pulley 28A.

The following are some commercially available components that can be used for an implementation of the exemplary sorting system 20 described above.

Magnet 20—Eriez Manufacturing Company (USA)

Grizzly vibrator 26—Syntron Material Handling LLC (USA), Sandvik Mining & Construction AB (Finland), and Deister Machine Company Inc. (USA)

Magnetic Resonance Analyzers 32B and 55B—NextOre Pty Ltd, Australia

Belt weightometers 32A and 54A (including belt speed measurement device and calibration check weights and calibrating mechanism)—Siemens Milltronics (Germany/USA), Thermo Scientific Ramsey (USA), and Thayer Scale, Hyer Industries, Inc. (USA)

Diverter 38 (including hydraulic actuator and pumping system and controls)—Vortex Global Inc. (USA)

Belt scraper 28C—Martin Engineering (USA)

It should be pointed out at this juncture that the sorting system 20 as described above is merely one exemplary embodiment of various sorting systems that can be constructed in accordance with this invention. Thus, for sorting copper-bearing ore the particular system components and their arrangement can be chosen as desired, providing that the system includes two magnetic resonance analyzer units and any type of diverter, wherein a first magnetic resonance analyzer unit controls the diverter to divert input copper-bearing ore to a product line when predetermined sorting criteria, e.g., a cut-off average percent value for a first predetermined length interval of time, is met, and a second magnetic resonance analyzer unit to measure the actual average percent content of the ore over a second predetermined length interval of time in the product line to dynamically adjust the sorting criteria to result in a product ore having a desired average percentage by weight of copper as measured over a second predetermined length interval of time. Moreover, as stated earlier the subject invention is not limited to sorting copper-bearing ore, but can be used to sort other metal bearing ore that can be analyzed by magnetic resonance.

Without further elaboration the foregoing will so fully illustrate our invention that others may, by applying current or future knowledge, adopt the same for use under various conditions of service.

We claim:

1. A system for sorting ore containing a desired target grade of metal-bearing ore from metal-bearing ore provided along a first conveyor, the desired target grade having a desired target average percentage by weight of the metal therein, said system comprising:
    a first magnetic resonance analyzing unit configured for measuring the percentage by weight of the metal in the metal-bearing ore on said first conveyor at successive points in time, for calculating the average percentage by weight of the metal in that ore measured over first predetermined length intervals of time;
    a controller establishing a cut-off value of the average percentage by weight of the metal in the metal-bearing ore for producing the desired target grade, said controller being configured for producing select signals when the average percentage by weight of the metal in the metal-bearing ore measured over said first predetermined length intervals of time on said first conveyor is equal to or greater than said cut-off value;
    a diverter configured for receiving the metal-bearing ore from the first conveyor and diverting it to either a collection path or a waste path, said collection path including a second moving conveyor, said diverter being configured to divert portions of the metal-bearing ore from said first conveyor to said second conveyor in response to said select signals;
    a second magnetic resonance analyzing unit configured for measuring the percentage by weight of the metal in the metal-bearing ore on said second conveyor at successive points in time, for calculating the average percentage by weight of the metal in that ore measured over second predetermined length intervals of time, said second magnetic resonance analyzing unit being coupled to said controller, whereupon said controller dynamically adjusts said cut-off value up or down to an adjusted value to produce said select signals if the average percentage by weight of the metal in the metal-bearing ore on said second conveyor measured over said second predetermined length intervals of time is below or above the desired target average percentage by weight, thereby causing said diverter to direct portions of said metal-bearing ore from said first conveyor to said second conveyor when the average percent by weight of the metal in the metal-bearing ore on said first conveyor measured over said first predetermined length intervals of time is equal to or greater than said adjusted value.

2. The system of claim 1, wherein the metal-bearing ore is copper-bearing ore and wherein the metal is copper.

3. The system of claim 2, wherein said first magnetic resonance analyzer unit is configured for providing first electrical signals indicative of the average percentage by weight of the metal in the ore on said first conveyor measured over said first predetermined length intervals of time, and wherein said controller also dynamically adjusts said cut-off value up or down to said adjusted value as a function of the direction of trend lines formed by connecting sequential measurements of percentage by weight of the copper in the copper-bearing ore measured over said first predetermined length intervals of time on the first conveyor in response to said first electrical signals.

4. The system of claim 3 wherein each of said trend lines has a slope, wherein the slopes of the trend lines are defined by continuous lines connecting sequential values of said first electrical signals, and wherein the variations in the slope of said trend lines are used by said controller to determine whether or not to further adjust said adjusted value.

5. The system of claim 2, wherein each of said conveyors are at least 150 feet long, wherein said predetermined speed of said first conveyor is in the range of 180 to 600 feet per minute, and wherein said first predetermined period of time is in the range of 1 to 10 seconds.

6. The system of claim 2 wherein the desired average percentage by weight for the desired target grade measured over a second predetermined interval length of time is 0.3%.

7. The system of claim 2, wherein said diverter is a pivoting chute diverter.

8. The system of claim 2, wherein said diverter is a diverter gate valve.

9. The system of claim 2, wherein said diverter is a flop gate.

10. A method for sorting ore containing a desired target grade of metal-bearing ore from metal-bearing ore, the desired target grade having a desired target average percentage by weight of the metal therein, said method comprising:
    providing the metal-bearing ore along a first moving conveyor having an exit point;
    using a first magnetic resonance analyzing unit to measure the percentage by weight of the metal in the metal-bearing ore on said first conveyor at successive points in time;
    calculating the average percentage by weight of the metal in that ore measured over first predetermined length intervals of time;
    providing a controller establishing a cut-off value of the average percentage by weight of the metal in the metal-bearing ore for producing metal-bearing ore at the desired target grade measured successively over second predetermined length intervals of time, said controller producing select signals when the average percentage by weight of the metal in the metal-bearing ore on said first conveyor measured over said first predetermined length intervals of time is equal to or greater than said cut-off value;
    diverting the metal-bearing ore from said first conveyor to a collection path including a second moving conveyor in response to said select signals;
    using a second magnetic resonance analyzing unit to measure the percentage by weight of the metal in said metal-bearing ore on said second conveyor over second predetermined length intervals of time;

calculating the average percentage by weight of the metal in said metal-bearing ore on said second conveyor measured over said second predetermined length intervals of time, whereupon said controller dynamically adjusts said cut-off value up or down to an adjusted value to produce said select signals if the average percentage by weight of the metal in said metal-bearing ore on said second conveyor measured over said second predetermined length intervals of time is below or above the desired target average percentage by weight; and diverting portions of said metal-bearing ore from said first conveyor to said second conveyor when said average percent by weight of said metal in said metal-bearing ore measured on said first conveyor over said first predetermined length intervals of time is equal to or greater than said adjusted value.

11. The method of claim 10 wherein said metal-bearing ore is copper-bearing ore and wherein the metal is copper.

12. The method of claim 11, wherein said controller also dynamically adjusts said cut-off value up or down to said adjusted value as a function of the direction of trend lines connecting sequential values of measured percentage by weight of the copper in the copper-bearing ore for said first predetermined length intervals of time on said first conveyor in response to said first electrical signals.

13. The method of claim 12 wherein each of said trend lines has a slope, wherein the slopes of said trend lines are defined by continuous lines connecting sequential values of said first electrical signals and wherein the variations in the slope of said trend lines are used by said controller to determine whether or not to further adjust said adjusted value.

14. The method of claim 11, wherein each of said conveyors is approximately 150 feet long, said predetermined speed of said conveyors is in the range of 180 to 600 feet per minute, and said first predetermined period of time is in the range of 1 to 10 seconds.

15. The method of claim 11, wherein the desired average target percentage by weight for the desired grade is 0.3%.

16. The method of claim 11, wherein said the copper-bearing ore on the second conveyor is delivered to a collection station.

17. The method of claim 11, wherein the copper-bearing ore on the first conveyor is delivered to a waste station when there is no select signal produced.

18. The method of claim 11, wherein said diverting is accomplished by a pivoting chute diverter.

19. The method of claim 11, wherein said diverting is accomplished by a diverter gate valve.

20. The method of claim 11, wherein said diverting is accomplished by a flop gate.

* * * * *